(12) United States Patent
Khan et al.

(10) Patent No.: US 9,543,425 B2
(45) Date of Patent: Jan. 10, 2017

(54) MULTI-FINGER LARGE PERIPHERY ALINN/ALN/GAN METAL-OXIDE-SEMICONDUCTOR HETEROSTRUCTURE FIELD EFFECT TRANSISTORS ON SAPPHIRE SUBSTRATE

(71) Applicant: University of South Carolina, Columbia, SC (US)

(72) Inventors: Asif Khan, Irmo, SC (US); Vinod Adivarahan, Columbia, SC (US)

(73) Assignee: University of South Carolina, Columbia, SC (US)

( * ) Notice: Subject to any disclaimer, the term of this patent is extended or adjusted under 35 U.S.C. 154(b) by 0 days.

(21) Appl. No.: 15/137,078

(22) Filed: Apr. 25, 2016

(65) Prior Publication Data

US 2016/0240647 A1    Aug. 18, 2016

Related U.S. Application Data

(62) Division of application No. 14/666,768, filed on Mar. 24, 2015, now Pat. No. 9,343,544.

(60) Provisional application No. 61/969,491, filed on Mar. 24, 2014.

(51) Int. Cl.

| | |
|---|---|
| *H01L 21/338* | (2006.01) |
| *H01L 29/778* | (2006.01) |
| *H01L 29/66* | (2006.01) |
| *H01L 29/20* | (2006.01) |
| *H01L 29/205* | (2006.01) |
| *H01L 29/78* | (2006.01) |
| *H01L 29/417* | (2006.01) |

(52) U.S. Cl.
CPC ....... *H01L 29/7787* (2013.01); *H01L 29/2003* (2013.01); *H01L 29/205* (2013.01); *H01L 29/66462* (2013.01); *H01L 29/66484* (2013.01); *H01L 29/66522* (2013.01); *H01L 29/7786* (2013.01); *H01L 29/7831* (2013.01); *H01L 29/41758* (2013.01)

(58) Field of Classification Search
CPC .......... H01L 29/2003; H01L 29/66462; H01L 29/7787; H01L 29/205
USPC .................... 438/172; 257/76, 194
See application file for complete search history.

(56) References Cited

U.S. PATENT DOCUMENTS

| | | | |
|---|---|---|---|
| 2006/0202272 A1* | 9/2006 | Wu | ..................... H01L 29/7787 257/355 |
| 2007/0228415 A1* | 10/2007 | Kanamura | .......... H01L 29/2003 257/192 |

* cited by examiner

*Primary Examiner* — Theresa T Doan
(74) *Attorney, Agent, or Firm* — Dority & manning, P.A.

(57) ABSTRACT

MOSHFET devices are provided, along with their methods of fabrication. The MOSHFET device can include a substrate; a multilayer stack on the substrate; a ultra-thin barrier layer on the multilayer stack, wherein the ultra-thin barrier layer has a thickness of about 0.5 nm to about 10 nm; a dielectric, discontinuous thin film layer on portions of the ultra-thin barrier layer, wherein the dielectric, discontinuous thin film layer comprises $SiO_2$; a plurality of source electrodes and drain electrodes formed directly on the ultra-thin barrier layer in an alternating pattern such that the dielectric, discontinuous thin film layer is positioned between adjacent source electrodes and drain electrodes; a plurality of gate electrodes on the dielectric, discontinuous thin film layer; and a gate interconnect electrically connecting the plurality of gate electrodes.

12 Claims, 7 Drawing Sheets

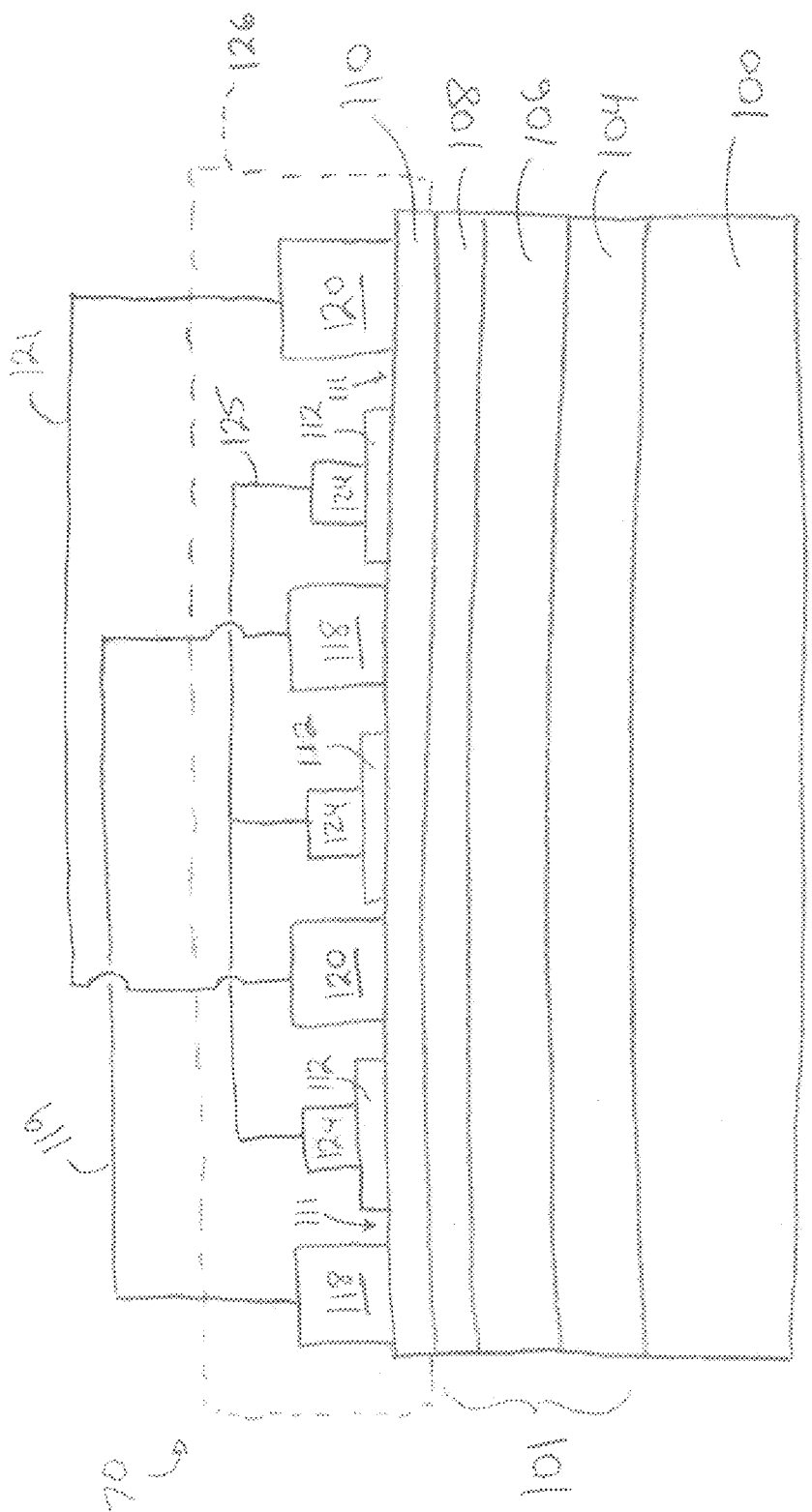

MULTI-FINGER LARGE PERIPHERY AlInN/AlN/GaN METAL-OXIDE-SEMICONDUCTOR HETEROSTRUCTURE FIELD EFFECT TRANSISTORS ON SAPPHIRE SUBSTRATE

PRIORITY INFORMATION

The present application is a divisional application of, and claims priority to, U.S. patent application Ser. No. 14/666,768 titled "Multi-Finger Large Periphery AlInN/AlN/GaN Metal-Oxide-Semiconductor Heterostructure Field Effect Transistors on Sapphire Substrate" of Khan, et al. on Mar. 24, 2015, and claims priority to U.S. Provisional Patent Application Ser. No. 61/969,491 titled "Multi-Finger Large Periphery AlInN/AlN/GaN Metal-Oxide-Semiconductor Heterostructure Field Effect Transistors on Sapphire Substrate" of Khan, et al. filed on Mar. 24, 2014; the disclosures of which are incorporated by reference herein.

BACKGROUND

Semiconductor power converters are key building blocks for various applications running the spectrum of powers from a few watts to mega-watts. To date, a majority of the applications use power converters that are based on silicon. For the very high power applications, several groups are now exploring AlGaN based converters as an alternative to silicon, especially when higher operation temperatures are required. Khan, et al. have previously reported the low to the moderate power converter applications by using AlGaN/GaN metal-oxide semiconductor heterostructure field-effect transistors (MOSHFET) based power switch. Since then, rapid progress has been made and several groups including Khan, et al., have reported on kilovolt switching using AlGaN based HEMTs with Schottky gates. In spite of the impressive performance levels, AlGaN/GaN HFET based switching devices suffer from problems such as current collapse, higher ON-state resistance, etc.

Recently, AlInN/GaN heterostructure field-effect transistors (HFETs) have emerged as a strong contender for the realization of high-power and high-frequency electronics for commercial and military applications. They are widely expected to outperform their AlGaN/GaN HEMT counterparts due to the system unique electronic properties such as a high polarization charge and the possibility to grow the materials lattice-matched. HFETs with current densities well above ~2 A/mm have already been demonstrated. These AlInN-based transistors also exhibited outstanding RF characteristics with a current gain cutoff frequency ($f_T$) reaching 370 GHz for a 30 nm gate length ($L_G$) device, and a maximum power of 10.3 W/mm with a power-added efficiency of 51% at 10 GHz under dc operation.

Furthermore, a much thinner AlInN barrier (e.g., less than about 12 nm) is usually needed to achieve the same or a higher two-dimensional electron gas (2DEG) charge density in the channel as compared to AlGaN/GaN system. Although such development appears to be very advantageous for device gate scaling below 50 nm for high speed electronics, while still maintaining a sufficiently high aspect ratio to suppress short-channel effects (SCEs), it may also lead to higher gate leakage currents and poor on/off ratios, which have previously been shown to have detrimental effects on the transistors performance and reliability. The metal-insulator-semiconductor (MIS) gate structure wherein a thin dielectric film is deposited on top of the barrier layer prior to gate formation represents a proven method to alleviate this issue along with enabling a larger gate voltage swing. Such insulated gate devices using either $SiO_2$, $Al_2O_3$, native oxides, or plasma treatment oxides, as the gate dielectrics have been reported to effectively reduce the gate leakage. However, because of the increased gate-to-channel separation, it is important to limit the insulator thickness to less than 5 nm in order to avoid i) a shift in the MISHFET threshold voltage (VTh) as compared to the Schottky structures, and ii) a degradation of both the extrinsic transconductance as well as the aspect ratio.

Most of the research works on both Schottky gate and insulated gate AlInN/GaN HFETs have been focused on small periphery devices with deep sub-micrometer gate technology that targets primarily high frequency (speed) electronics applications. To the best of our knowledge, there has been only one study of large periphery AlInN-based HFETs for power electronics applications. However, these devices with a 7 nm barrier layer, a 250 nm gate length ($L_G$) and a 2.5 mm gate width ($W_G$), delivered a low dc drain current density of 620 mA/mm and exhibited a high leakage current of about 2.5 mA/mm under reverse bias.

SUMMARY

Objects and advantages of the invention will be set forth in part in the following description, or may be obvious from the description, or may be learned through practice of the invention.

MOSHFET devices are generally provided, along with their methods of fabrication. In one embodiment, the MOSHFET device includes a substrate; a multilayer stack on the substrate; a ultra-thin barrier layer on the multilayer stack, wherein the ultra-thin barrier layer has a thickness of about 0.5 nm to about 10 nm; a dielectric, discontinuous thin film layer on portions of the ultra-thin barrier layer, wherein the dielectric, discontinuous thin film layer comprises $SiO_2$; a plurality of source electrodes and drain electrodes formed directly on the ultra-thin barrier layer in an alternating pattern such that the dielectric, discontinuous thin film layer is positioned between adjacent source electrodes and drain electrodes; a plurality of gate electrodes on the dielectric, discontinuous thin film layer; and a gate interconnect electrically connecting the plurality of gate electrodes.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures.

FIG. 7 shows an schematic cross-section of an exemplary MOSHFET device, according to one embodiment.

DEFINITIONS

Figure 1:
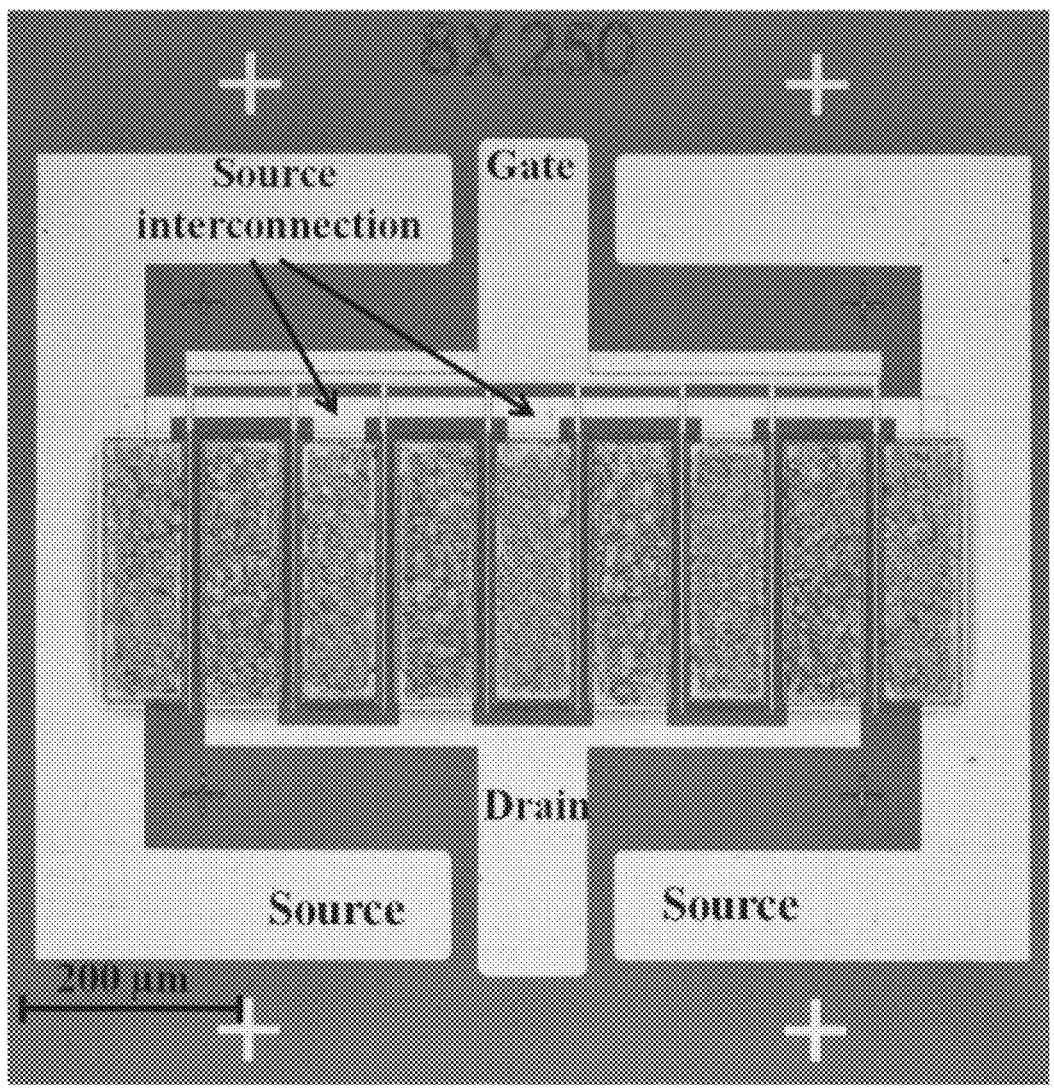
FIG. 1 shows a CCD image of a multi-finger (8×250 μm=2 mm gate width) AlInN/GaN MOSHFET on a sapphire substrate fabricated using SiN bridges for source electrodes interconnections.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the device to the viewer.

Additionally, although the invention is not limited to any particular film thickness, the term "thin" describing any film layers of the semiconductor device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

A large periphery lattice-matched AlInN/GaN MOSHFET on sapphire is generally provided, along with methods of forming the same. In one embodiment, the large periphery lattice-matched AlInN/GaN MOSHFET on sapphire includes i) a very thin $SiO_2$ layer as the dielectric material for gate insulation, ii) a multi-finger gate pattern, and iii) SiN-based air-bridging approach for source contacts interconnections. High drain currents of 0.57 A and 1.3 A were measured for a 20×(1.8×250 µm²) gate MOSHFET in dc and pulsed mode, respectively. To the best of our knowledge, these data represent the highest output currents delivered by a single AlInN/GaN MOSHFET on sapphire substrate, while maintaining a very low gate leakage of less than 6 µA at −10 V gate bias. The threshold voltage and extrinsic transconductance for the largest device ($W_G$=5 mm) were −3.69 V and 210 mS, respectively. Furthermore, our experimental data also reveal a nearly linear scaling of the devices dc characteristics with gate width up to 1 mm before self-heating effects occurs while a weak increase in the leakage current was observed for all MOSHFETs. These results show an excellent potential of multi-finger insulated gate AlInN/GaN HFETs for high power electronics applications involving switches, inverters and converters.

I. Non-Polar and Semi-Polar Substrates

The substrate can be formed from any suitable non-polar or semi-polar base layer. Suitable base layers can include materials such as, but are not limited to, sapphire, silicon carbide, lithium aluminate, spinel, gallium nitride, aluminum nitride, aluminum gallium nitride, indium gallium nitride, aluminum indium gallium nitride, and the like. In one particular embodiment, the base layer is in the form of a substrate. Any suitable non-polar or semi-polar substrate can be used as the base layer to grow the group III nitride epilayer. Although the following description discusses a "substrate", other types of base layers can be used in accordance with the present invention.

Non-polar substrates generally encompass those grown in a-plane, r-plane, or m-plane. For example, the non-polar substrate can be an m-face or r-plane sapphire substrate such that there is no polarization charge supplied in the device layers of this structure.

Non-polar and semi-polar III-Nitride substrates are of great interest to the nitride semiconductor device community because they enable the deposition of improved device active regions that can be used to realize new and improved high performance optoelectronic and electronic nitride semiconductor devices. Some theoretical predictions believe that non-polar and semi-polar GaN will enable higher quantum efficiencies and improved electrical characteristics for light emitting diodes (LEDs) and laser diodes and will enable the development of very high performance enhancement mode (e-mode) high electron mobility transistors (HEMTs). While such predictions have been partially corroborated by experiments, previous attempts to fabricate devices on non-polar GaN were severely hampered by the presence of very high defect densities in the active regions which had origins in the substrates and which derived from the heteroepitaxial approaches used in the non-native approach to their fabrication.

II. Epilayer Growth

No matter the starting base layer for forming the substrate, a group III nitride epilayer is grown over the base layer. "Group III nitride" refers to those semiconducting compounds formed between elements in Group III of the periodic table and nitrogen. More preferably the Group III element is selected from the group consisting of aluminum (Al), gallium (Ga), and/or indium (In). Ternary and quaternary compounds (e.g., AlGaN and AlInGaN) are particularly preferred. As is well understood in the art, the Group III elements can combine with nitrogen to form binary compounds (e.g., GaN, AlN and InN), ternary compounds (e.g., AlGaN, AlInN, and GaInN), and quaternary compounds (i.e., AlInGaN).

The group III nitride epilayer can be composed of any combination of group III elements (e.g., Al, In, and Ga) and nitride. In one particular embodiment, the group III-nitride epilayer can be represented by the formula $Al_xIn_yGa_{1-x-y}N$, wherein $0.1 \le x \le 1$, $0.1 \le y \le 1$ and $0 < x+y \le 1$. In employing growth techniques to grow the group III nitride epilayer, the precursor sources typically include a metal-organic source (e.g., trimethyl aluminum, trimethyl gallium, triethyl gallium, trimethyl indium), a nitrogen source (e.g., ammonia), a carrier gas (e.g., hydrogen and/or nitrogen), and an optionally doping source (e.g., silane, biscyclopentadienyl magnesium, etc.). Of course, other materials can be utilized to grow the group III nitride epilayer, and the present invention is not intended to be limited by the above listed materials. For example, another type of a metal-organic source and/or a nitrogen source can be utilized to grow the group III nitride epilayer.

The group III nitride epilayer can be applied on a substrate using any suitable technique, including but not limited to, metalorganic chemical vapor deposition (MOCVD), hydride vapor phase epitaxy (HVPE), molecular beam epitaxy (MBE), metalorganic hydride vapor phase epitaxy (MOHVPE), pulsed atomic layer epitaxy (PALE) growth technique, pulsed lateral overgrowth techniques (PLOG) (useful for growth of a group III nitride epilayer on a patterned wafer), or any combination of any of the deposition methods.

Pulse atomic layer epitaxy (PALE) allows accurate control of the quaternary layer composition and thickness by simply changing the number of aluminum, indium, and gallium pulses in a unit cell and the number of unit cell repeats. By controlling the pulse time, pulse condition, flow rate, and therefore chemical availability, the systematic growth provides a layer with significant control of the composition, thickness and crystalline quality.

Pulsed lateral overgrowth (PLOG) is a technique wherein a Group III comprising material (e.g., triethyl gallium or trialkyl aluminum) and a nitrogen material (e.g., ammonia) are supplied in a vapor phase for deposition of the Group III nitride. With pulsed lateral overgrowth the flow rate of the Group III material is maintained at a constant rate whereas the flow rate of the nitrogen compound is systematically altered, preferably from full flow (On-state) to no-flow (Off-state), in a predetermined sequence as set forth in "Vertically Faceted Lateral Overgrowth of GaN on SiC with Conducting Buffer Layers Using Pulsed Metalorganic Chemical Vapor Deposition", Fareed et al., Applied Physics Letters, Vol. 77, Number 15, 9 Oct. 2000, page 2343-5. By controlling the flow rate, and therefore chemical availability, of the nitrogen compound systematic growth of select crystallographic planes can be accomplished. The systematic growth provides a layer which significantly mitigates transfer of dislocations caused by lattice mismatches through the layer.

In one embodiment, a method is generally disclosed of forming a HEMT device on a plurality of thin film layers on a substrate. For example, FIG. 7 shows a multilayer stack 101 that forms the plurality of thin film layers on the substrate 100 (e.g., a sapphire substrate, a silicon carbide, gallium nitride, aluminum nitride, aluminum gallium nitride or aluminum indium gallium nitride substrate, or any other suitable semiconductor substrate). In the embodiment shown, the multilayer stack 101 includes a group III nitride epilayer 104 on the substrate 100, a back barrier layer 106 on the group III nitride epilayer 104, and a spacer layer 108 on the back barrier layer 106. Although not shown, a second group III nitride epilayer can be positioned between the back barrier layer 106 and the spacer layer 108. In one particular embodiment, a buffer layer (not shown) can be positioned between the group III nitride epilayer 104 and the substrate 100. Thus, while the exemplary multilayer stack 101 is shown including these layers, it should be understood that any substrate having a group III nitride epilayer can be subjected to the processes presently described. Thus, the particular substrate is not intended to be limited by the examples described herein.

In one embodiment, the group III nitride epilayer 104 can include $Al_xIn_yGa_{1-x-y}N$, where $0 \le x \le 1$, $0 \le y \le 1$ and $0 < x+y \le 1$. For example, the group III nitride epilayer 104 can include a short period superlattice that is grown via pulsed atomic layer epitaxy to form adjacent layers having a chemical structure of $Al_xIn_yGa_{1-x-y}N$ and $Al_rIn_sGa_{1-r-s}N$, respectfully, where $0 \le x \le 1$, $0 \le y \le 1$ and $0 < x+y \le 1$, $0 \le r \le 1$, $0 \le s \le 1$, $0 < r+s \le 1$, with x and r being different and y and s being different. In one particular embodiment, the group III nitride epilayer 104 can include gallium nitride (e.g., a GaN layer). The group III nitride epilayer 104 can be constructed from any combination of group III elements and nitrogen, as explained above. This layer can be formed, in one particular embodiment, through PALE in order to selectively control the composition and thickness of the group III nitride epilayer 104.

Similarly, the back barrier layer 106 can, in one embodiment, include $Al_xIn_yGa_{1-x-y}N$, where $0 \le x \le 1$, $0 \le y \le 1$ and $0 \le x+y \le 1$. In one embodiment, both x and y are 0, such the back barrier layer 106 includes GaN (e.g., an i-GaN layer).

Similarly, the spacer layer 108 can include $Al_xIn_yGa_{1-x-y}N$, where $0 \le x \le 1$, $0 \le y \le 1$ and $0 < x+y \le 1$. For example, the spacer layer 108 can include aluminum nitride. The spacer layer 108 can, in one embodiment, be deposited by pulsed atomic layer epitaxy.

According to the present invention, an ultra-thin barrier layer 110 is formed on the multilayer stack 101 (i.e., on the plurality of thin film layers), as shown in FIG. 7. For example, the ultra-thin barrier layer 110 can be formed to a have a barrier thickness of about 0.5 nm to about 10 nm (e.g., about 1 nm to about 7.5 nm, such as about 3 nm to about 6 nm). In one embodiment, the ultra-thin barrier layer 110 can include $Al_xIn_yGa_{1-x-y}N$, where $0 \le x \le 1$, $0 \le y \le 1$ and $0 < x+y \le 1$. For instance, the ultra-thin barrier layer 110 can include aluminum indium nitride (e.g., AlInN).

A dielectric, discontinuous thin film layer 112 is formed over the multilayer film stack 101 to leave exposed areas 111 of the ultra-thin barrier layer 110 (i.e., that are substantially free from and uncovered by the dielectric, discontinuous thin film layer 112), as shown in FIG. 7. The dielectric, discontinuous thin film layer 112 is single or multistack layer of silicon dioxide, silicon nitride, silicon oxynitride, aluminum oxide, zirconium oxide, etc. In one particular embodiment, the dielectric, discontinuous thin film layer 112 has a thickness of about 1 nm to about 100 nm. For example, the dielectric, discontinuous thin film layer can be formed from silicon oxide or a silicon nitride through a Digital Dielectric Deposition (DDD) technique (also described as digital oxide deposition (DOD) and/or digital nitride deposition (DND)), such as described in U.S. Publication No. 2013/0017689 of Khan, et al. filed on May 7, 2007, and U.S. Publication No. 2010/0187545 of Khan, et al. filed on Apr. 7, 2010, both of which are incorporated by reference herein.

A dielectric, discontinuous thin film layer 112 is then formed over the portion of the ultra-thin barrier layer 110 to leave exposed areas 111 of the ultra-thin barrier layer 110 via (1) masking the ultra-thin barrier layer 110 with a photoresist layer in areas that correspond to the resulting exposed areas 111 while leaving the portion unmasked, and (2) pulsing a silicon source and an oxygen source to deposit the dielectric, discontinuous thin film layer 112 on the portion of the ultra-thin barrier layer 110.

The thickness of this dielectric, discontinuous thin film layer 112 is, in one embodiment, about 3 to about 10 nm.

Optionally, a selective area growth source drain (SAG S-D) thin film layer can be formed over the exposed areas 111 of the ultra-thin barrier layer 110 while leaving the dielectric thin film layer 112 exposed (i.e., that are substantially free from and uncovered by the SAG S-D thin film layer 114). In one embodiment, the SAG S-D thin film layer has a thickness of about 3 nm to about 15 nm. In one embodiment, the SAG S-D thin film layer can include $Al_xIn_yGa_{1-x-y}N$, where $0 \le x \le 1$, $0 \le y \le 1$ and $0 < x+y \le 1$. For instance, the SAG S-D thin film layer can, in one particular embodiment, include AlInN.

III. Electrode Formation

As shown in FIG. 7, a source 118 and drain 120 can then be added on exposed areas 111 (and the SAG S-D thin film layer, if present) of the ultra-thin barrier layer 110 in an alternating pattern such that the dielectric, discontinuous thin film layer 112 is positioned between each source 118 and drain 120 combination. A gate electrode 124 is positioned on the dielectric, discontinuous thin film layer 112, as shown in FIG. 7.

According to one particular embodiment, each of the source 118, drain 120, are deposited simultaneously. In this embodiment, the source and drain contacts are deposited first, and then annealed. Then, the dielectric, discontinuous thin film layer 112 is deposited next, followed the gate.

After the completion of the interconnected gate electrodes 124 deposition using known standard processes, the drain, gate and source pads or probes (thick yellow electrodes shown in FIG. 1) are deposited.

A passivation layer 126 is then deposited on the entire device or outside the mesa to insulate the gate electrodes 124 and the underlying layers. For example, the silicon based passivation layer 126 can be deposited via a digital dielectric deposition method, and can be formed from silicon nitride. Window openings are next made into the passivation layer 126 to ensure air bridging of the source contacts.

As shown in FIG. 1, the source interconnection (119 in FIG. 7) is located on one side of the device 70 whereas the drain interconnection (121 in FIG. 7) is on the opposite side of the device 70. That is, the source interconnection is positioned over a first area of the ultra-thin barrier layer 110 while the drain interconnection is positioned over a second area of the ultra-thin barrier layer 110 such that the two areas do not contact each other and form an interlaced source-gate-drain electrode structure.

EXAMPLES

The fabrication and study is generally provided for multi-gate AlInN/InN/GaN metal-oxide semiconductor heterostructure field-effect transistors over sapphire substrate with gate widths varying from 250 µm to 5 mm (e.g., 0.25 mm to 5 mm). A high saturation output current of about 1.3 A and a maximum extrinsic transconductance of 210 mS are demonstrated for the 5 mm wide device with a gate length of 1.8 µm and a source-drain spacing of 12 µm. The maximum saturation output current and the maximum extrinsic transconductance appear to scale nearly linearly with the gate width up to 1 mm beyond which joule heating dominates. These results show the potential of these MOSHFETs for high-voltage and high power operation.

First, a pulsed atomic layer epitaxy technique was used to grow the high quality thin (e.g., having a thickness of about 4.5 nm) AlInN barrier layer.

Second, a digital oxide deposition (DOD) technique was used to deposit ultra-thin silicon dioxide as gate dielectric.

The same DOD technique is then used to deposit the thick silicon nitride dielectric layer for forming the metal bridging electrode to interconnect the source contacts. The DOD technique avoids damaging the thin barrier structures, thus providing excellent method to block the gate leakage currents.

The source-drain ohmic-contacts were separated by a distance of 12 µm. Ni (700 Å)/Au (300 Å) metal scheme was used as gate electrodes on top of the $SiO_2$ dielectric film. Each gate electrode was 1.8 µm long and 250 µm wide. The large periphery device geometry had an interlaced source-gate-drain electrode structure.

The source-to-source connections go over the gate electrodes with a 300 nm thick $SiN_x$ layer in between for isolation. A CCD image of the fabricated multi-finger device with a 5 mm total gate width is depicted in FIG. 1.

Figure 2:
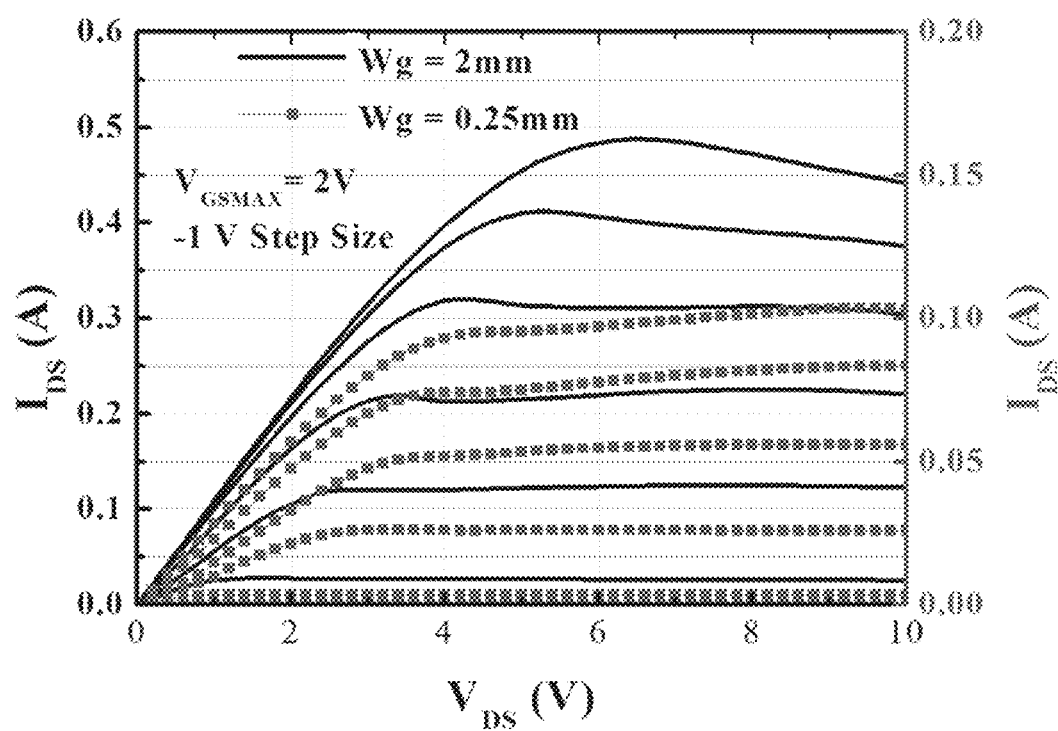
FIG. 2 shows typical dc output characteristics of 0.25 mm and 2 mm AlInN/GaN MOSHFETs.

FIG. 2 shows the MOSHFET total gate width dependence of the dc and pulsed drain saturation currents ($I_{DSsat}$) measured on wafer at a gate-source bias ($V_{GS}$) of 0 V. The results reveals nearly a linear scaling of $I_{DSsat}$ versus $W_G$ up to 1 mm gate width before Joule heating effects start impacting the devices behavior with further increasing the gate size. The maximum dc and pulsed drain output currents appear to saturate at ~0.57 A and 1.30 A, respectively, for $W_G \ge 4$ mm. To the best of our knowledge, these data represent the highest output currents delivered by a single AlInN/GaN MOSHFET on sapphire substrate. Furthermore, our devices exhibited very low gate leakage currents that were better than 6 A and 20 µA at −10 V and 2 V gate bias, respectively even for a device periphery with gate widths up to 4 mm (See FIG. 3).

Unlike in previous study on large periphery insulated gate AlGaN/GaN HFETs on SiC, the AlInN/GaN MOSHFETs grown on sapphire were found to exhibit a nearly linear dependence of both dc and pulsed peak output currents on the total device gate width up to $W_G$=1 mm only, before they saturate. The same behavior was also observed for the maximum static extrinsic transconductance (gm) along with a limited change in the gate-source current-voltage characteristics.

Experimental

The epilayer heterostructure was grown by low-pressure metal organic chemical vapor deposition (MOCVD) on a 2-in diameter sapphire substrate. It consisted of 1.8 µm thick unintentionally-doped GaN buffer layer, 1 nm-thick AlN spacer layer, and above 5 nm thick AlInN barrier with a nominal Al content of 83%. The thin AlN interlayer was introduced to reduce alloy disorder scattering and thus improve the transistors transport properties. Room temperature Hall effect measurements yielded a two-dimensional electron gas (2DEG) sheet charge density of $1.86 \times 10^{13}$ $cm^{-2}$ and Hall mobility of 1569 $cm^2$/V.s. The wafer sheet resistance was ~228 Ω/□.

The device geometry had an interlaced source-gate-drain electrode design. The gate electrode exhibited a multi-finger pattern, and the source-to-source connections go over the gate electrodes with a SiN layer in-between for metals isolation. A CCD image of the fabricated multi-finger device with a 2 mm total gate width is depicted in FIG. 1. Device fabrication process began with mesa isolation, which was achieved in an inductively coupled plasma (ICP) etching reactor using a $BCl_3/Cl_2$ gas mixture. Ti(150 Å)/Al(700 Å)/Ti(300 Å)/Au(500 Å) metal stacks were then evaporated and alloyed at 850° C. for 30 sec in nitrogen gas ambient to form the source and drain ohmic contacts. Ni (70 nm)/Au (70 nm) gate electrodes were next deposited between the source-drain contacts, with (for MOSHFETs) and without (for HFETs) $SiO_2$ gate dielectric. The 30-40 Å of silicon-oxide dielectric material was deposited using pulsed plasma enhanced chemical vapor deposition (PECVD) technique. Each single gate electrode (1 finger) measured 1.8 μm in length and 250 μm in width. After the contact pads formation, pulsed PECVD processes were used to realize 300 nm thick SiN passivation layer. The same SiN layer was then used to ensure air bridging of the source contacts in devices with more than two finger-gates. Ti/Au metal electrodes were finally deposited to form the low resistance section source-to-source interconnections that go over the gate electrodes.

Results and Discussions:

The dc characteristics of the depletion-mode (D-mode) AlInN/GaN MOSHFETs were measured with an Agilent 4155B semiconductor parameter analyzer. FIG. 2 shows typical output characteristics for 1×(1.8×250) μm² and 8×(1.8×250) μm² devices. Maximum drain currents ($I_{DSMax}$) of 116 mA and 483 mA were obtained at $V_{GS}$=+2 V and $V_{DS}$=+7 V for the small and large periphery MOSHFETs, respectively. Note that the devices were completely pinched-off below −4 V gate bias. While the self-heating effects seem to be negligible for the 0.25 mm device up to +2 V gate bias ($V_{GS}$) and $V_{DS}$=10 V, the 2 mm devices exhibited drain currents drop with increasing the drain-source voltage beyond ~7 V and for $V_{GS}$ greater than −1 V.

With increasing gate width, the devices suffer severe self heating problem because of the larger power dissipation ($P_{diss}$). The $P_{diss}$ of the MOS-HFET/HFET can be expressed as $$P_{diss}=I_{DS}V_{DS}+I_GV_{GS}.$$

The corresponding effective temperature, Teff of the device can be described by $$Teff=R_{TH}(I_{DS}V_{DS}+I_GV_{GS})T_{Sub}$$

Where $R_{TH}$ is the thermal resistance and $T_{sub}$ is the temperature of the substrate. Higher Teff are expected in larger devices since larger devices suffer from severe self-heating due to much higher $I_{DS\ max}$ than smaller device. Kuball et al. has showed a liner relationship of power dissipation vs maximum temperature rise where it was reported that channel temperature is about 180° C. for 0.65 W of power dissipation of AlGaN/GaN HFETs on sapphire whereas for AlGaN/GaN HFETs on SiC the temperature was about 120° C. for 1.75 W of power dissipation. In our case, the dissipated power for 2 mm device is 4.4 W ($I_{DS}$=440 mA at $V_{DS}$=10V) which increases the channel temperature significantly. The lattice-scattering-limited conductivity due to the thermal vibrations of the atoms limits the electron conduction in the metal and the enhanced carrier-carrier scattering phenomenon due to the elevated temperature degraded $I_{DS,max}$. Furthermore, the increased temperature decreases the mobility, μ which directly affects the $I_{DS}$.

Figure 3:
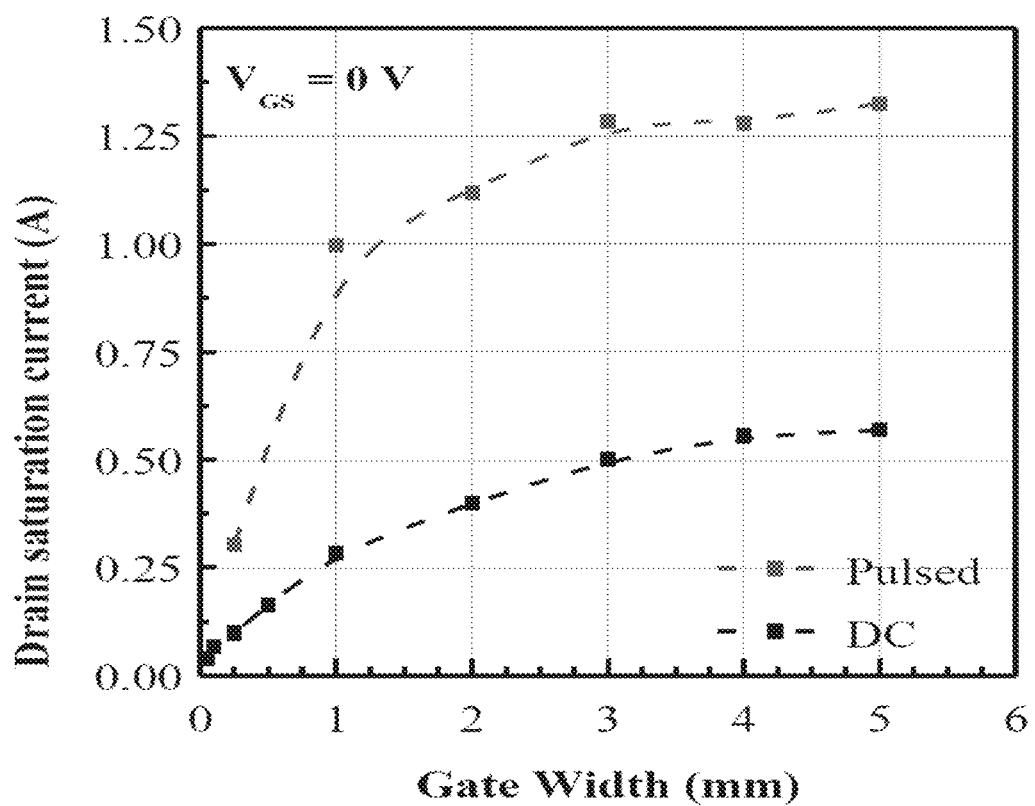
FIG. 3 shows the variation of AlInN/GaN MOSHFET drain saturation current with gate width measured in dc and pulsed modes, at $V_{GS}$=0V.

The dc and pulsed (pulse width=0.2 μs, 1 ms pulse separation) current-voltage (I-V) curves were compared for different multi-gate (MG) devices. The dependence of the saturation drain current on the total gate width for our AlInN/GaN MOSHFETs at $V_{GS}$=0 V is shown in FIG. 3. As can be seen from the plot, the results reveals nearly a linear scaling of $I_{DSsat}$ versus WG up to ~1 mm gate width before Joule heating effects start impacting the devices behavior with further increasing the gate size. The maximum dc and pulsed drain output currents appear to saturate at ~0.57 A and 1.30 A, respectively, for $W_G$≥4 mm. The maximum drain current did not scale up as expected due to the joule heating, resulting lower current density. This behavior is due to self-heating effects, which are further exacerbated by sapphire substrate with its low thermal conductivity.

Study using micro-Raman scattering technique for temperature distribution of self-heating in multi-finger AlGaN/GaN HFETs revealed the fact that the heat is more concentrated in the center of the device and the temperature decreases sharply at location away from the central channel region. The reason for the higher temperature in the central area of the multi-finger device is the thermal crosstalk. Increasing the channel to channel spacing reduces the thermal crosstalk thus decrease the temperature. It is also found that the junction temperature increases with increasing gate width. Therefore, to mitigate the self-heating effects, it is suggested that reducing the width of a single finger is more effective than reducing the finger numbers for devices with the same total gate width. This self-heating problem can be resolved by optimizing the design of the device since the finger width, number of fingers and the spacing is critical factors for thermal management and by the use of SiC substrates as well.

Figure 4:
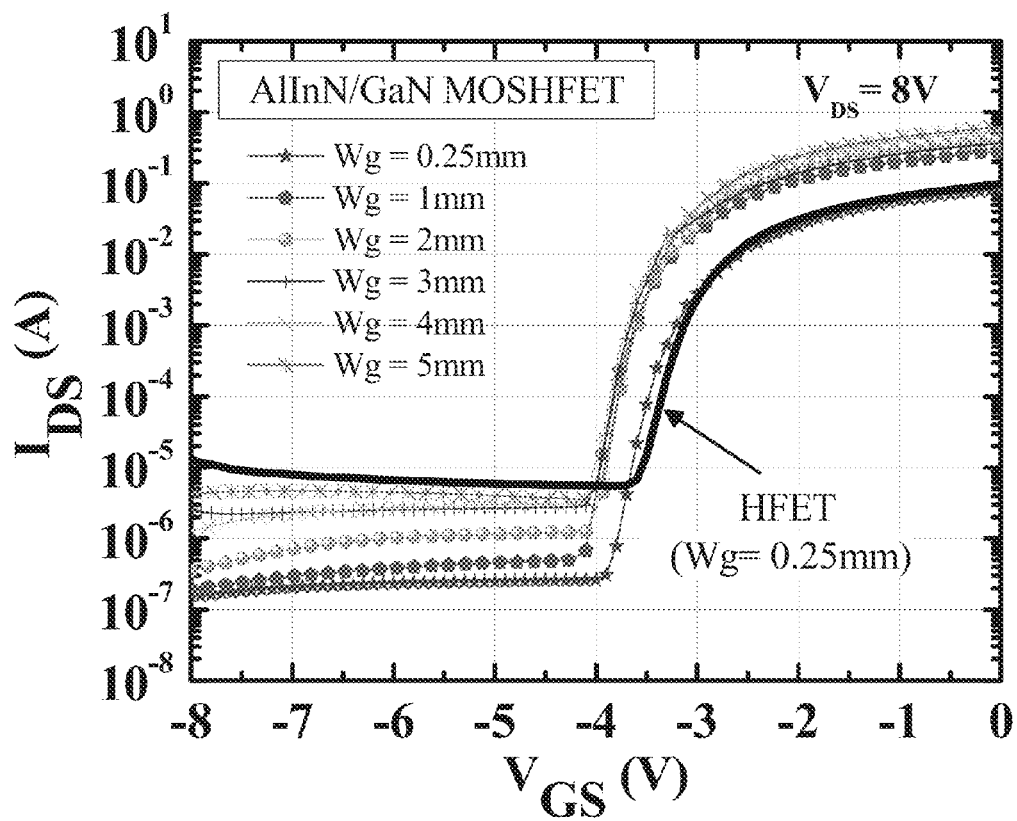
FIG. 4 shows dc transfer characteristics for AlInN/GaN MOSHFETs with different gate peripheries. The result obtained for 0.25 mm HFET is also shown for comparison.

FIG. 4 illustrates typical dc transfer characteristics measured at $V_{DS}$=8 V for MG MOSHFETs with varying gate widths and HFET with $W_G$=0.25 mm. There is very small threshold voltage shift of less than ~0.4 V between MOSHFET and HFET of the same $W_G$=0.25 mm. The threshold voltage of the different periphery devices was next extracted from the slope of the $I_{DS}^{0.5}$–VGS curves.

A small change in the threshold voltage ($V_{Th}$), by about 0.12 V, was observed when the gate periphery was varied in the range 0.25-5 mm. For the largest device, the threshold voltage was −3.76 V while $V_{Th}$=−3.69 V was measured for the 0.25 mm MOSHFET. The sub-threshold current levels increases with the increasing gate width for all MOSHFETs but still are below the sub-threshold current of HFET with 0.25 mm gate width. Since the Vth depends on the 2DEG carrier density, the increased $n_{2DEG}$ due to the passivation effect might be the reason why the larger devices have slightly more negative Vth and increasing sub-threshold currents.

Figure 5:
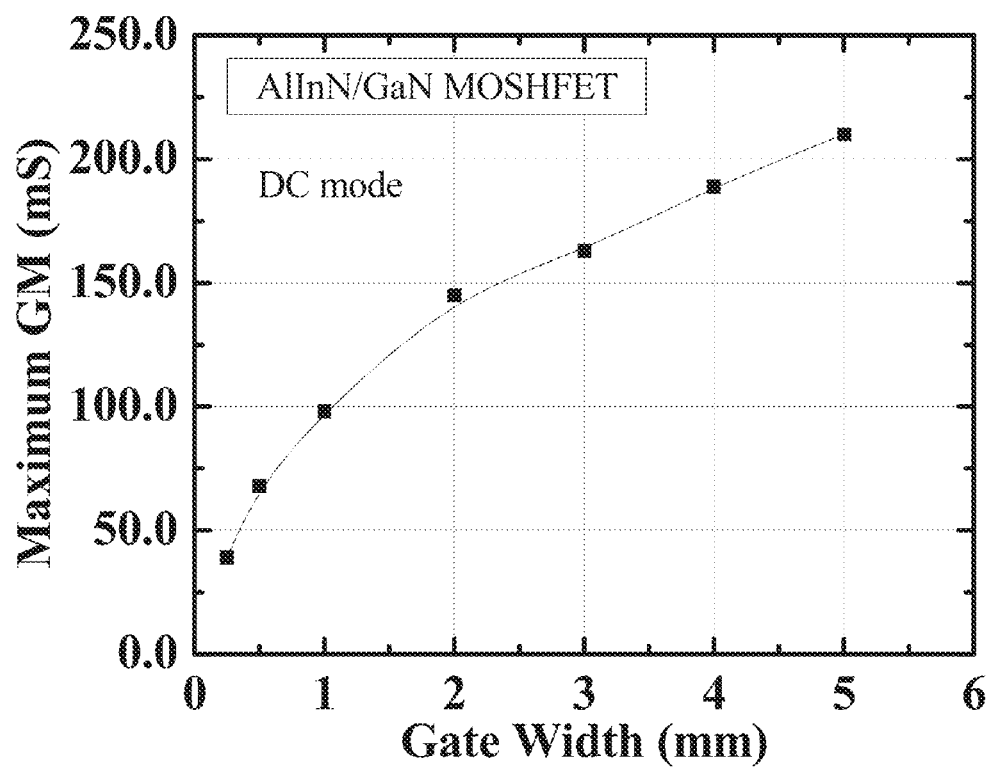
FIG. 5 shows the variation of the maximum dc transconductance of AlInN/GaN MOSHEMTs as a function of gate width measured in the saturation regime at $V_{DS}$=8 V.

The variation of the maximum extrinsic transconductance ($g_{mMax}$) as a function of the gate width is depicted in FIG. 5. The data were derived from the transfer characteristics measured in dc mode (see FIG. 4). Like with the other dc parameters, the results indicate an almost linear scaling with gate width up to 1 mm. For 5 mm gate width, $g_{mMax}$ was about 210 mS whereas it was 39 mS for gate width for $W_G$=0.25 mm. The reason of MG large periphery devices have lower $g_{mMax}$ might be the enhanced phonon scattering due to increased channel temperature.

Figure 6:
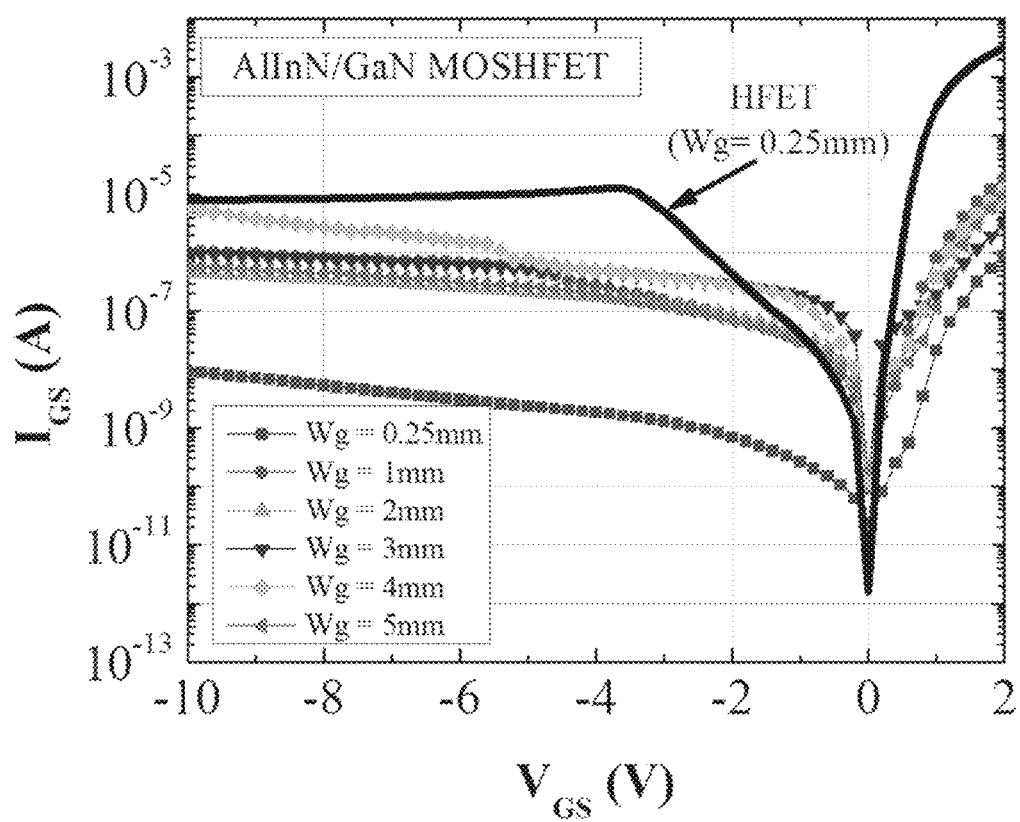
FIG. 6 shows dc measurements of the gate leakage currents ($I_{GS}$) for the 0.25 mm HFET and MOSHFETs with up to twenty-finger gates (i.e $W_G$=5 mm) showing a weak dependence of $I_{GS}$ on the device periphery.

In FIG. 6, the insulated gate characteristics for the MG devices are shown. All curves seem to exhibit similar profiles with increasing the gate width. Also, despite the thin oxide layer the current levels were suppressed to below the ~20 μA under both reverse and forward biases. The thermionic emission (TE) and thermionic field emission (TFE) are the dominant conduction mechanisms for the forward bias and for the reverse bias, there are many possible conduction mechanisms such as trap-assisted tunneling (TAT), Poole- Frenkel (PF) emission, and TFE. Since the MOS-gate structure provides barrier height and thickness to suppress carrier transportation in the forms of TE and TFE, it is reasonable for MOSHFETs to have lower gate leakage at forward bias.

More importantly, the gate leakage current seem to show a very weak dependence on the device periphery as it is found to vary between 0.5 µA and 5.7 µA at $V_{GS}$=−10 V and in the range 3-19 µA under+2 V gate bias for gate width of 1-5 mm, still below the gate leakage current of 7 µA at −10V and 3 mA at 2V gate bias for the HFET with 0.25 mm gate width. This is due to the thin SiO2 gate dielectric layer. It is worth mentioning here that the subthreshold slope (SS) of MG MOSHFETs has not degraded (in FIG. 4). J. W. Chung et al. observed that the SS is related to the gate leakage. The larger gate leakage makes SS worse. Due to the gate leakage suppression, large peripheries MOSHFETs SS have not degraded.

It was previously shown that the gate leakage current per unit area in AlGaN/GaN HFETs and AlInN/GaN MOSHFETs remains the same when either the gate width or gate length is varied, respectively. This was not the case for the devices studied in the present work. IGS was found to substantially increase when WG was increased from 250 µm to 1 mm, then no clear dependency with further increasing the gate width was observed. What is causing this behavior is still not well understood at this moment, but material and/or process non uniformity might be a factor. It is also known that the leakage current can originate from i) the parasitic leakage of the mesa regions or in the region where the gate feed runs over the mesa wall or ii) the presence of the SiN passivation layer which degrades the gate diode characteristics by introducing surface leakage current in the SiN layer or at its interface.

The three terminal off-state breakdown voltages were measured for several MOSHFET devices using the 1 mA/mm criteria. The gate-source bias applied was −6 V, which was about 2 V lower than the threshold voltage and no fluorinert solution, which usually prevents surface flashover and prevents to a premature device breakdown, was used. The breakdown voltage was found to be 110-137 V for the 0.15 mm devices and dropped down to 70 V for the large periphery MOSHFET with $W_G$~1 mm. Note that the surface passivation drastically increases the peak electric field at the drain side of the gate which can cause the local Schottky-barrier breakdown at the lower drain bias.

It is well known that the use of SiN passivation suppresses the rf dispersion for AlGaN/GaN HFETs by removing the surface states which relives the channel depletion as well. Therefore, with less surface states on the access region the higher ns−µ product is obtained to exhibit the higher $I_{DS,max}$ and $g_{mMax}$. However it also results in increase in gate-leakage currents. More investigation about the quality of gate dielectric and the effect and methods of reducing such leakage currents along with the study of the interface traps and defects are currently underway.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A method of forming a semiconductor field-effect transistor, the method comprising:
    forming a multilayer stack on the substrate, wherein the multilayer stack comprises a group III nitride epilayer, a back barrier layer, and a spacer layer;
    forming a ultra-thin barrier layer on the multilayer stack, wherein the ultra-thin barrier layer has a thickness of about 0.5 nm to about 10 nm;
    forming a dielectric, discontinuous thin film layer comprising $SiO_2$ on portions of the ultra-thin barrier layer while leaving other portions exposed;
    forming a plurality of source electrodes and drain electrodes on the exposed areas of the ultra-thin barrier layer in an alternating pattern such that the dielectric, discontinuous thin film layer is positioned between adjacent source electrodes and drain electrodes; and
    forming gate electrodes on the dielectric, discontinuous thin film layer.

2. The method of claim 1, further comprising:
    forming a gate interconnection to electrically connect the gate electrodes.

3. The method of claim 2, further comprising:
    forming a passivation layer on the device.

4. The method of claim 3, further comprising:
    forming a source interconnection to electrically connect the source electrodes; and
    forming a drain interconnection to electrically connect the drain electrodes, wherein the source electrodes and the drain electrodes are electrically isolated from each other.

5. The method of claim 1, wherein the source electrodes and the drain electrodes have an interlaced source-gate drain electrode structure.

6. The method of claim 1, wherein the substrate comprises sapphire, and wherein the multilayer stack comprises a group III nitride epilayer, a back barrier layer, and a spacer layer.

7. The method of claim 6, wherein the group III nitride epilayer comprises $Al_xIn_yGa_{1-x-y}N$, where $0 \leq x \leq 1$, $0 \leq y \leq 1$ and $0 < x+y \leq 1$, and wherein the back barrier layer comprises $Al_xIn_yGa_{1-x-y}N$, where $0 \leq x \leq 1$, $0 \leq y \leq 1$ and $0 \leq x+y \leq 1$.

8. The method of claim 6, wherein the group III nitride epilayer comprises GaN, and wherein the back barrier layer GaN.

9. The method of claim 6, wherein the spacer layer comprises $Al_xIn_yGa_{1-x-y}N$, where $0 \leq x \leq 1$, $0 \leq y \leq 1$ and $0 < x+y \leq 1$.

10. The method of claim 1, wherein the ultra-thin barrier layer comprises $Al_xIn_yGa_{1-x-y}N$, where $0 \leq x \leq 1$, $0 \leq y \leq 1$ and $0 < x+y \leq 1$.

11. The method of claim 1, wherein the ultra-thin barrier layer comprises AlInN.

12. The method of claim 1, wherein the ultra-thin barrier layer has a thickness of about 0.5 nm to about 10 nm.

* * * * *